United States Patent
McColl et al.

(10) Patent No.: US 10,568,789 B2
(45) Date of Patent: Feb. 25, 2020

(54) AUTOMATIC WHEELCHAIR LOCK, LOCK PLATES, HUB CONNECTOR, MAGNETIC PERSISTENT DRIVER, AND ROTATION MECHANISM, AND SYSTEMS AND METHOD USING THE SAME

(71) Applicants: Mark McColl, Birmingham, AL (US); Clayton Brackett, Birmingham, AL (US)

(72) Inventors: Mark McColl, Birmingham, AL (US); Clayton Brackett, Birmingham, AL (US)

(73) Assignee: Mark McColl, Birmingham, AL (US)

( * ) Notice: Subject to any disclaimer, the term of this patent is extended or adjusted under 35 U.S.C. 154(b) by 0 days.

(21) Appl. No.: 16/381,710

(22) Filed: Apr. 11, 2019

(65) Prior Publication Data

US 2019/0314229 A1 Oct. 17, 2019

Related U.S. Application Data

(60) Provisional application No. 62/656,555, filed on Apr. 12, 2018.

(51) Int. Cl.
*A61G 5/10* (2006.01)
*G06F 3/044* (2006.01)

(52) U.S. Cl.
CPC ......... *A61G 5/1021* (2013.01); *A61G 5/1035* (2013.01); *G06F 3/044* (2013.01)

(58) Field of Classification Search
CPC ...... A61G 5/1021; A61G 5/1035; G06F 3/044
USPC .......................................................... 701/70
See application file for complete search history.

(56) References Cited

U.S. PATENT DOCUMENTS

| | | | |
|---|---|---|---|
| 6,264,007 B1* | 7/2001 | Norton | B60T 1/005 188/2 F |
| 7,341,123 B2* | 3/2008 | Brendel | A61G 5/045 180/65.51 |
| 8,522,908 B1 | 9/2013 | Collins et al. | |
| 2005/0087954 A1 | 4/2005 | Wakita et al. | |

(Continued)

FOREIGN PATENT DOCUMENTS

CA  2985450 A1 * 5/2018 ............... A61G 5/04

OTHER PUBLICATIONS

International Search Report and Written Opinion dated Aug. 7, 2019 from PCT Application No. PCT/US19/26972.

*Primary Examiner* — Marthe Y Marc-Coleman
(74) *Attorney, Agent, or Firm* — Troutman Sanders LLP; Brennan M. Carmody

(57) ABSTRACT

An automatic wheelchair locking system comprising: a first touch sensor configured to detect a touch of a first wheel of a wheelchair; a first lock for the first wheel; a first motor configured to engage and disengage the first lock; at least one processor configured to communicate with the first touch sensor and control the first motor; and a memory having stored thereon instructions that, when executed by the at least one processor, control the at least one processor to: in response to receiving sensor information indicative of a user touching the wheel while the first lock is engaged, control the first motor to disengage the first lock; and in response to receiving sensor information indicative of no user touching the wheel while the first lock is disengaged, control the first motor to engage the first lock.

20 Claims, 9 Drawing Sheets

(56) References Cited

U.S. PATENT DOCUMENTS

| | | | |
|---|---|---|---|
| 2005/0173888 A1* | 8/2005 | Stamps | A61G 5/10 280/250.1 |
| 2007/0051566 A1 | 3/2007 | Marlow | |
| 2014/0265497 A1 | 9/2014 | Hough et al. | |
| 2016/0270989 A1 | 9/2016 | Yentzer et al. | |
| 2017/0042713 A1* | 2/2017 | Nurmikko | A61B 5/0006 |
| 2017/0347885 A1* | 12/2017 | Tan | A61B 5/0022 |

* cited by examiner

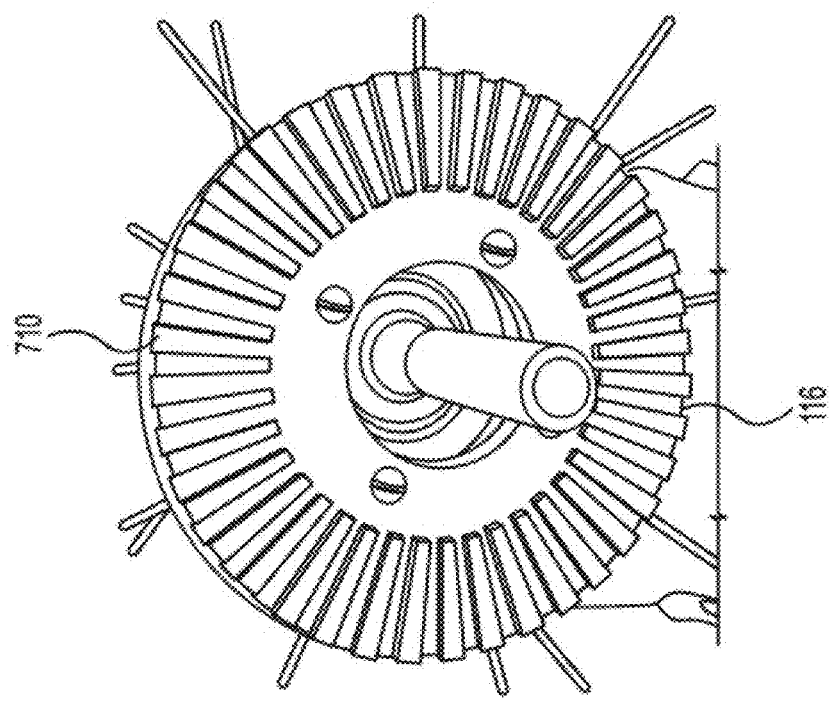
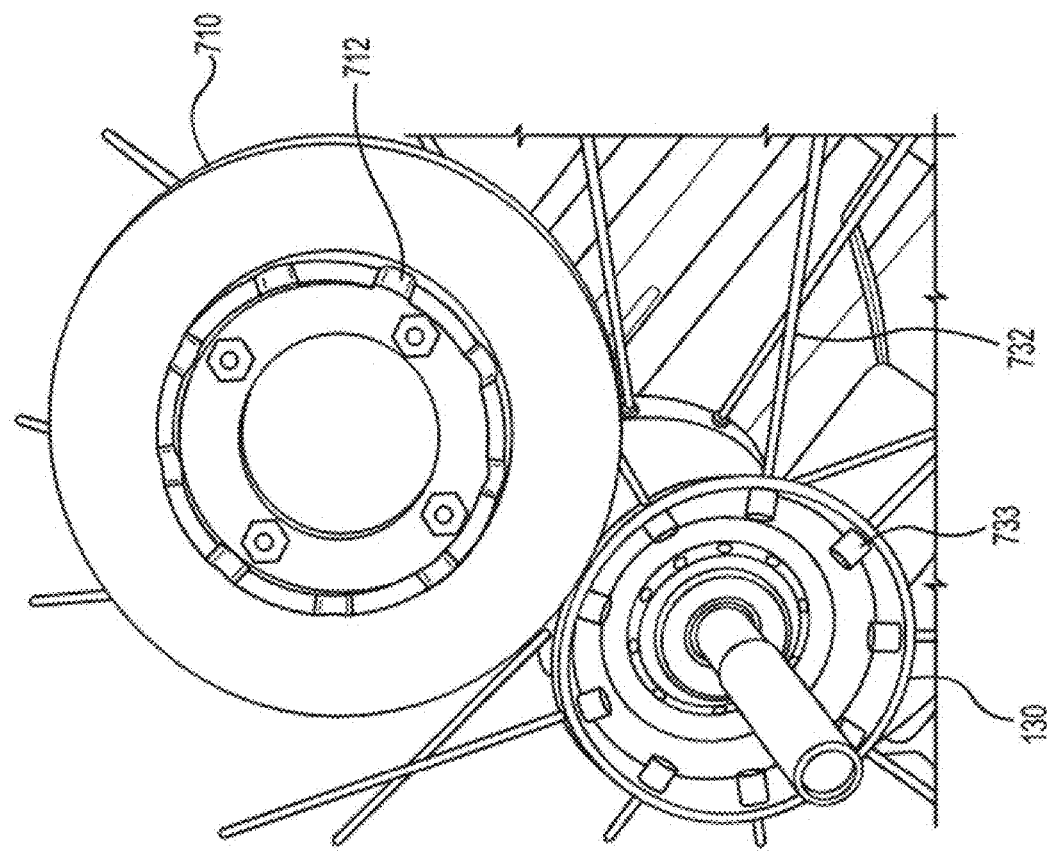
FIG. 7B
FIG. 7A

AUTOMATIC WHEELCHAIR LOCK, LOCK PLATES, HUB CONNECTOR, MAGNETIC PERSISTENT DRIVER, AND ROTATION MECHANISM, AND SYSTEMS AND METHOD USING THE SAME

CROSS-REFERENCE TO RELATED APPLICATIONS

This application claims the benefit of U.S. Provisional Application No. 62/656,555 filed Apr. 12, 2018, the entirety of which is incorporated by reference as if set forth in full below.

FIELD

The present disclosure generally relates to wheelchair locks, and, more particularly, variously to wheelchair locks, lock plates, hub connectors, magnetic persistent drivers, and rotation mechanisms, and systems and methods using the same.

BACKGROUND

Users of manual wheelchairs face many challenges and frustrations. Among these is the constant need to lock and unlock their wheels as they go through their normal daily activities. Something as simple as getting a gallon of milk from the refrigerator can required multiple lock/unlock cycles. For instance, a wheelchair user would have to lock before opening the door, unlock to navigate to the milk, lock to pick up the milk, unlock to navigate to the door, lock to close the door, unlock to navigate to a table, and lock to pour the milk. Similar steps are required to put the milk back into the refrigerator. Related art systems require manual activation and deactivation their locks, resulting in inconvenience to users. Accordingly, it is desirable to provide wheelchair locks that automatically lock and unlock the wheels in an easy, intuitive manner.

Therefore, according to certain aspects of the disclosure there is provided various designs for an automatic wheelchair locking mechanisms.

Moreover, certain improvements to automatic wheelchair locks may be provided using one or more of lock plates, hub connectors, magnetic persistent drivers, and certain rotation mechanisms. One or more of these features have independent use in various applications other than wheel-chair mechanisms. These features are independently within the scope of the present disclosure.

SUMMARY

According to some embodiments, there is provided an automatic wheelchair locking system including: a first touch sensor configured to detect a touch of a first wheel of a wheelchair; a first lock for the first wheel; a first motor configured to engage and disengage the first lock; at least one processor configured to communicate with the first touch sensor and control the first motor; and a memory having stored thereon instructions that, when executed by the at least one processor, control the at least one processor to: in response to receiving sensor information indicative of a user touching the wheel while the first lock is engaged, control the first motor to disengage the first lock; and in response to receiving sensor information indicative of no user touching the wheel while the first lock is disengaged, control the first motor to engage the first lock.

According to some embodiments, there is provided an automatic wheelchair locking system including: a touch sensor configured to detect a touch of a wheel of a wheelchair; a motion sensor configured to detect motion of the wheelchair; a lock for the wheel; and a motor configured to engage and disengage the lock in response to detection signals from the touch sensor and the motion sensor.

According to some embodiments, there is provided an automatic wheelchair locking system including: a motion sensor configured to detect motion of a wheelchair; a brake for a wheel of the wheelchair; and a motor configured to engage and disengage the brake based on detection signals from the motion sensor.

According to some embodiments, there is provided an automatic wheelchair locking system including: means for determining whether a hand is touching a wheel of a wheelchair; means for determining whether the wheel is in motion; a locking mechanism for locking the wheel; and means for automatically engaging the locking mechanism when the wheel is not in motion and a hand is not touching the wheel, and for automatically disengaging the locking mechanism when a hand touches the wheel.

According to some embodiments, there is provided a wheelchair having an automatic locking system.

According to some embodiments, there is provided a magnetic persistent driver including: a base including at least one base magnet; and a pin including at least one pin magnet, the base being configured to rotate with respect the pin between a first and second rotational position, and the pin being configured to move translationally with respect to the base. The at least one base magnet and the at least one pin magnet may be configured to be substantially aligned in opposite polarities in the first rotational position of the base, and to be substantially aligned in same polarities in the second rotational position of the base.

According to some embodiments, there is provided a hub connector including: a hub-facing side including a plurality of brackets protruding therefrom and configured to mate to a backside of spokes intruding into a hub; and a front-face positioned opposite the hub-facing side.

BRIEF DESCRIPTION OF THE DRAWINGS

The accompanying drawings, which are not necessarily drawn to scale, and which are incorporated into and constitute a portion of this disclosure, illustrate various implementations and aspects of the disclosed technology and, together with the description, serve to explain the principles of the disclosed technology. In the drawings:

FIGS. 7A and 7B illustrate a wheel hub and hub connector according to an example embodiment

DETAILED DESCRIPTION

Figure 1:
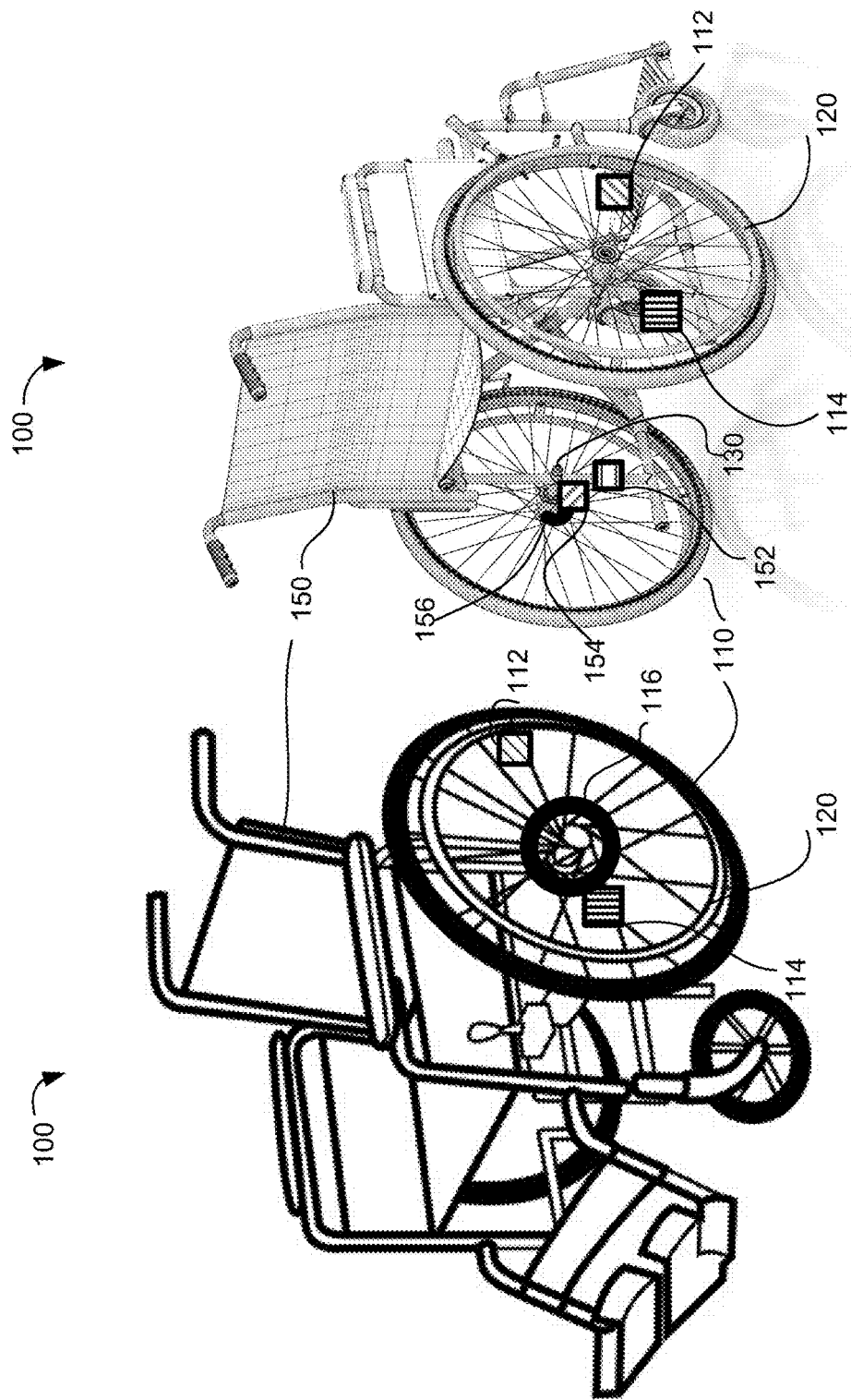
FIG. 1 illustrates front and rear perspective views of a wheel chair including an automatic locking mechanism according to an example embodiment.

Certain aspects of the present disclosure relate to wheelchair locks. The wheelchair locks operate automatically. For example, in some cases, the locks may automatically engage when the wheelchair is substantially still and the user's hands are not touching the wheels. The locks may automatically disengage when a user places a hand on one or both wheels. In some implementations, each lock may disengage independently, for example, based on whether a user is touching the corresponding wheel.

In some cases, motion of the wheelchair may be detected using motion sensors, such as one or more of gyroscopic sensors connected to one or more wheels, and one or more accelerometers attached to one or more wheels or the wheelchair. Some implementations may utilize capacitive technology (e.g., capacitive touch sensors) to determine whether a user's hands are touching a wheel (e.g., hand rims). In some cases, the motion sensors and capacitive sensors may communicate with a controller to activate the locking mechanism. In some cases, the motion sensor and/or capacitive sensors only transmit a change in state to the controller.

In some embodiments, the wheelchair locks operate automatically with minimal, if any, conscious input from the user. Additionally, in some cases, the locks add as little weight to the chair as possible. To that effect, certain implementations operate using minimal amount of power to enable the use of smaller batteries and enable the use of rechargeable batteries which may operate for an entire day.

In certain cases, complementary pairs of lock plates may be disposed on the wheels of a wheelchair, facing a body of the wheelchair, and the body of the wheelchair facing the wheels. The complementary pairs may be driven into each other, the complementary pairs may mate, locking the wheels of the wheelchair. In some cases, at least one of each pair of lock plates is substantially disk shaped, enabling the complementary pairs to mate in any wheel rotation.

In some implementations, the lock plates disposed on the body of the wheelchair may be mounted on respective locking pins. The locking pins may be driven toward the lock plates disposed on the wheels, similarly driving the lock plates.

In some cases, the lock plates and/or locking pins may be driven by respective magnetic persistent drivers. Magnets may be rotated, repelling magnets located in the lock plate/pin, and forcing the lock plates to mate. By using magnets, a persistent force may be applied to the lock plates. In such cases, the persistent force limits the error of incomplete locking. For example, if the lock plates do not align when the locking mechanism is activated, without a persistent force, the wheels may role unimpeded. However, with a persistent force, the wheels may only roll to the point that the faces align, and the locking is completed. Moreover, the persistent force enables power to only be consumed when the state of the locks is changed.

In some cases, a motor may rotate the magnets. The motor may be activated in response to signals detected by the motion sensors and capacitive sensors. In some implementations, the motor may be a step motor. In some cases, a direct current motor may rotate the magnets. In some cases, the motor may be a limited rotation motor.

In some cases, one or more of the lock plate, the motion sensors, and the capacitive touch sensors may be connected to the wheel-mounted a hub connector. The hub connector may be secured into the interior face of the wheel hub. Securing elements to the wheel hub limits the additional moment of inertia added to the wheels by the locking system.

While certain aspects of the present disclosure are discussed primarily with reference to wheelchair locks, one of ordinary skill will recognize that this is merely for illustration purposes only. For example, lock plates, hub connectors, magnetic persistent driver, and rotation mechanisms may have uses in a variety of mechanical and electromechanical systems and applications.

Reference will be made in detail to example embodiments of the disclosed technology, examples of which are illustrated in the accompanying drawings and disclosed herein. Wherever convenient, the same references numbers will be used throughout the drawings to refer to the same or like parts.

Automatic Wheelchair Lock

In some embodiments, there may be provided a wheelchair lock that automatically engages and disengages based on use conditions. For example, the wheelchair locks may engage when the wheelchair is stationary and there is no hand touching of hand rims. The wheelchair locks may disengage when a touch of the hand rims is detected. In some cases, a button may be provided to enable the disengagement of the wheelchair locks, for example, to enable the use of push handles or for various other circumstances. In some embodiments, the engagement and/or disengagement may be controlled using a separate computing device (e.g., a smart phone) connected to the wheelchair lock (e.g., wirelessly connected through an application). In some implementations, parameters for engaging/disengaging the lock may be set using a separate computing device (e.g., a smart phone).

FIG. 1 illustrates front and back perspective views of an example wheelchair 100. The wheelchair 100 includes front wheels 105, back wheels 110, and wheelchair body 150. Back wheels 110 include hand rims 120, which are used to propel the chair, and wheel hubs 130. Back wheels 110 are connected to the wheelchair body 150 through rear axle 130. One of ordinary skill will recognize that a wheelchair may be made in various forms, made with various suitable materials, and include many features, such as arm rests, removable footrests, and push handles. Accordingly, such elements will not be discussed explicitly in great detail for compactness.

In some cases, capacitive touch sensor 112, motion sensor 114, and wheel-mounted lock plate 116 may be connected to back wheels 110. In some embodiments, one or more of capacitive touch sensor 112, motion sensor 114, and wheel-mounted lock plate 116 may be connected to back wheels 110 through a hub connector, for example, as discussed below in more detail with reference to FIGS. 7A and 7B. However, this is merely an example, and one of ordinary skill will recognize alternative means of mounting various items to back wheel 110. For example, wheel-mounted lock plate 116 may be attached to the wheel 110 by clipping to spokes or spoke ends on the interior of the hub.

Figure 9B:
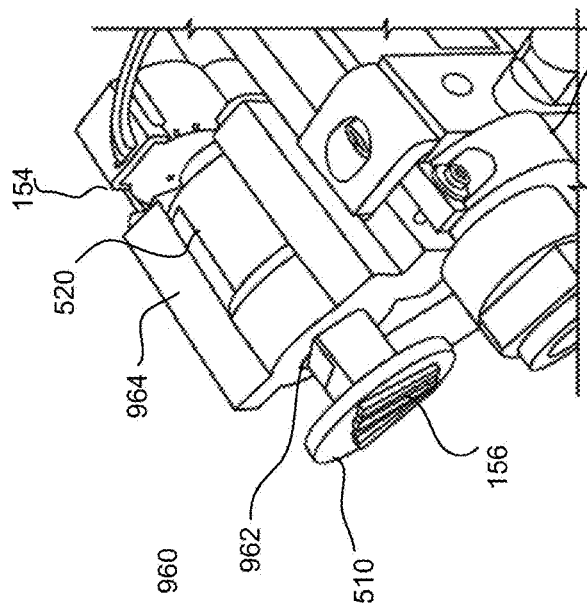
FIGS. 9A-9C illustrate various views of example mounting brackets and mountings according to an example embodiment.
Figure 9A:
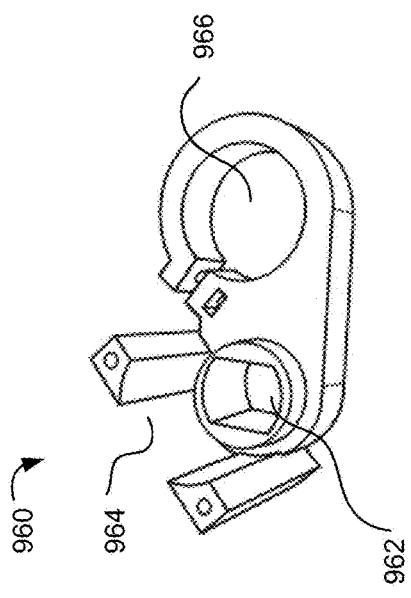
Figure 9C:
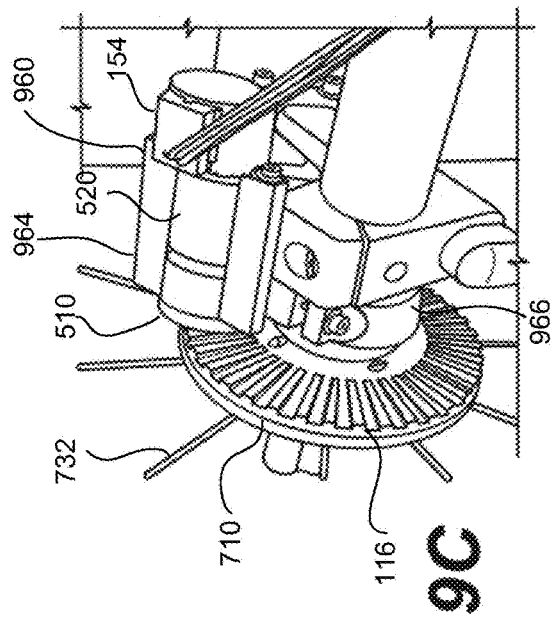

In some implementations, processor 152 (e.g., microprocessor 152), motor 154, and body-mounted lock plate 156, may be connected to rear axle 130. One or more of processor 152, motor 154, and body-mounted lock plate 156 may be connected to rear axle 130 using one or more mounting brackets. Various views of example mounting brackets and mountings are illustrated in FIGS. 9A-9C.

Capacitive touch sensor 112 may detect a user's touch to hand rim 120. For example, capacitive touch sensor 112 may be connected to hand rim 120 using an electrical wire. In some cases, capacitive touch sensor 112 may be sensitive enough to detect a user's touch through gloves or other obstacles. In some instances, the sensitivity of capacitive touch sensor 112 may be adjustable, either by user indication (e.g., through a mobile application) or automatically (e.g., based on weather). In some implementations, each back wheel 110 may include one or more capacitive touch sensors 112 configured to detect whether a user is touching the respective hand rim 120.

Motion sensor 114 may be, as non-limiting examples, a gyroscopic sensor, an accelerometer, or a velocity meter. The gyroscopic sensor may detect angular velocity of back wheel 110 to determine whether back wheel 110 is in motion (e.g., whether the wheel is moving). For example, the gyroscopic sensor may transmit current x, y and z angles of the wheel to processor 152, which compares the current values with previous values and determines whether back wheels 110 (and therefore the chair 100) is in motion. An accelerometer may determine a change of speed of back wheels 110 and a velocity meter may determine a speed of back wheels 110. In some implementations, each back wheel 110 may include one or more motion sensors 114 configured to detect whether the respective back wheel 110 is in motion. In some embodiments, a motion sensor 114 may be disposed on body 150 and may measure movement of the body 150 of the wheelchair 100.

Processor 152 (e.g., a microprocessor) may communicate with one or more of capacitive touch sensor 112 and motion sensor 114. For example, in some cases, capacitive touch sensor 112 and motion sensor 114 may communicate with processor 152 using one or more wireless protocols. In some cases, capacitive touch sensor 112 and motion sensor 114 may provide sensor data to processor 152, which may determine whether a user is touching hand rim 120 and/or back wheels 110 are moving.

In some implementations, capacitive touch sensor 112 and motion sensor 114 may provide an interpretation of their respective sensor data (e.g., whether a user is touching the rim or back wheels 110 are moving) to processor 152. For example, a separate wheel-mounted processor may be connected to back wheels 110, and sensor data from capacitive touch sensor 112 and motion sensor 114 may be provided to processor 152 through the wheel-mounted processor and a transceiver. In some cases, the wheel-mounted processor may only communicate with processor 152 once it determines a change in state of the motion or touch has occurred. In some embodiments, the wheel-mounted processor may further provide processor 152 with battery power information for a wheel mounted battery (see, e.g., FIG. 2). The wheel-mounted processor, transceiver, and/or sensors may be grounded to the hub of the wheel.

Processor 152 may control motor 154 to engage body-mounted lock plate 156. For example, in response to processor 152 determining that the user is not touching hand rims 120 and that back wheels 110 are not moving (or are substantially not moving), processor 152 may activate motor 154 to drive body-mounted lock plate 156 to mate with wheel-mounted lock plate 116. For example, wheel-mounted lock plate 116 and body-mounted lock plate 156 may be disposed facing each other and have complementary teeth. When engaged, wheel-mounted lock plate 116 and body-mounted lock plate 156 are pressed together and the respective teeth mate. Lock plates 116 and 156 are discussed in greater detail below with regards to FIGS. 8A and 8B.

In some embodiments, the lock plates 116 and 156 may be arranged in different fashions. For example, lock plate 166 may be disposed on a shoe lining and lock plate 116 may be disposed on an inner surface of a drum in a drum brake configuration. When the motor 154 is activated, the shoe will expand, mating lock plate 156 with lock plate 116. As another example, one or more lock plates 156 may be disposed on inner-caliper surfaces and one or more lock plates 116 may be disposed on a surface of a disc or rotor in a disc brake configuration. When the motor 154 is activated, the caliper will contract, mating lock plate 156 with lock plate 116. These configurations are merely examples, and various alternatives, adjustments, and modifications will be obvious to one of ordinary skill in light of the present disclosure.

Although lock plates 116, 156 may be used as a locking mechanism, one of ordinary skill will recognize that this is merely an example. In some embodiments, alternative locking mechanisms may be utilized. As non-limiting examples, the respective locking mechanisms for scissor locks, wheel hub locks (e.g., D's Locks), and push/pull locks may be mechanized (e.g., automatically controlled by a motor), as would be understood by one of ordinary skill in view of the present disclosure.

Additionally, one of ordinary skill will recognize that, in some implementations, brakes as locks (e.g., in addition to locks or in lieu of locks). For example, in some cases, one or more disc brake, drum brake, or rotor brake may be automatically activated and/or deactivated in accordance with aspects of the present disclosure. As a non-limiting example, processor 152 may trigger a pneumatic mechanism to activate one or more braking mechanisms. In some embodiments, a braking force may be variably applied, for example, based on a determined incline of the wheelchair.

In some embodiments, the functionality of one or more of capacitive touch sensor 112, motion sensor 114, and/or processor 152 may be incorporated into a single package. Moreover, one or more of capacitive touch sensor 112, motion sensor 114, and/or processor 152 may be attached to wheel 110 or an axel of wheelchair 100. In certain instances, the device may incorporate additional functionality, for example, to determine a decline/incline of the wheelchair 100 (e.g., based on a gyroscope), a rate of speed of the wheelchair 100, or the like. In some cases, one or more of the motion sensor 114 and/or processor 152 may be configured to determine distance traveled and elevation gained based on, for example, sampling of decline/incline and/or rate of speed of the wheelchair 100.

Although the present disclosure is generally discussed with reference to a capacitive touch sensor 112, this is merely an example. Various alternatives will be apparent to one of ordinary skill in light of the present disclosure. For example, hand rim 120 may include (or have placed thereon) a pressure sensor to determine whether a hand is on the wheel. As another example, a user may utilize a special glove (e.g., with particularly conduct material) to touch hand rim 120, or the glove may be configured to determine when the user is touching hand rim 120. Further, in some implementations hand rim 120 may include various forms of touch sensors and/or proximity sensors (e.g., an electric field proximity detector, lidar, motion sensor, or the like). In certain embodiments, processor 152 may be configured to interpret the signals from one or more of these sensors to determine whether a user is touching the wheel rim 120.

Figure 2:
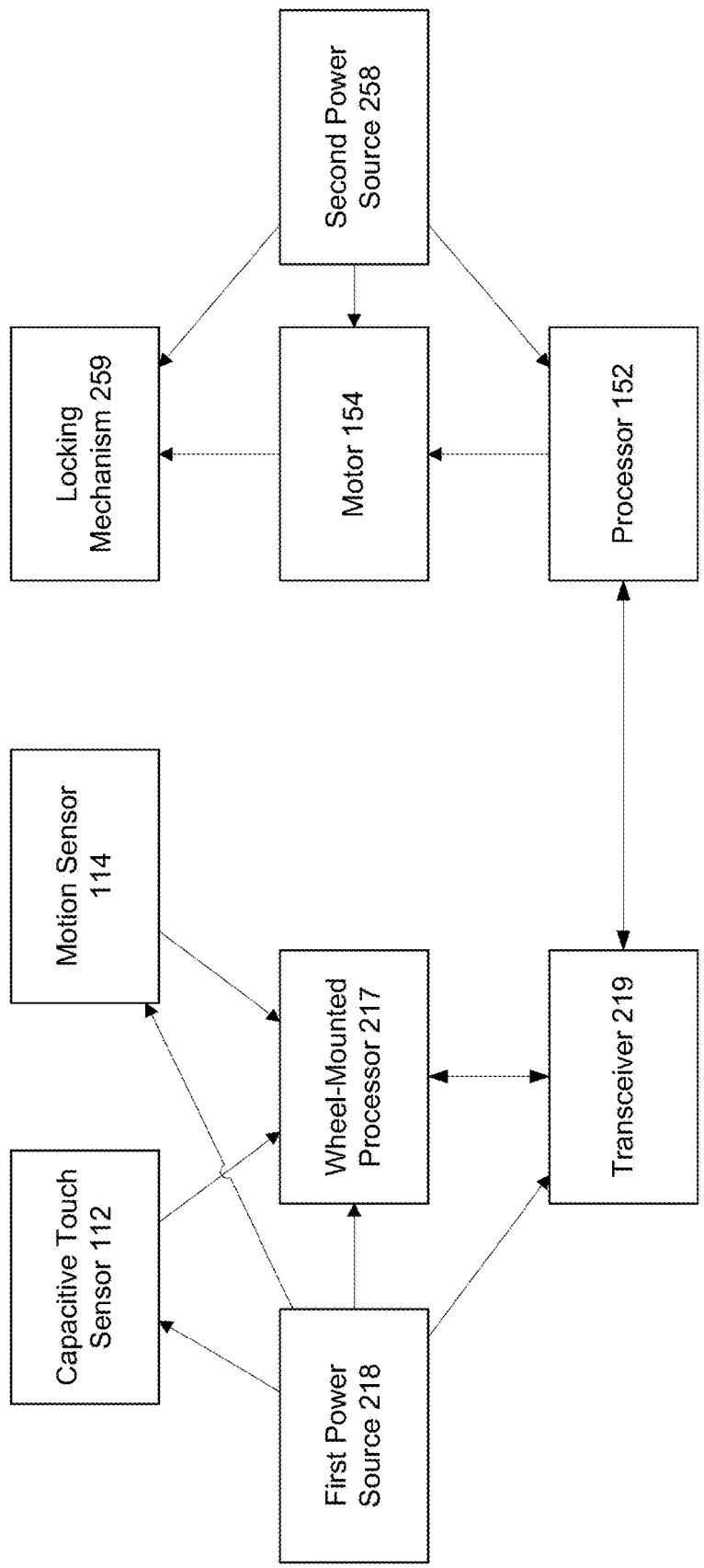
FIG. 2 is a block diagram of an example automatic locking system according to an example embodiment.

FIG. 2 is a block diagram of an example system 200 according to an example embodiment. The system 200 includes capacitive touch sensor 112, motion sensor 114, wheel-mounted processor 217, first power source 218, transceiver 219, processor 152, motor 154, second power source 268, and locking mechanism 219. First power source 218 provides power to capacitive touch sensor 112 and motion sensor 114. Likewise, second power source 268 provides power to processor 152 and motor 154.

As discussed above, capacitive touch sensor 112 detects whether a user is touching hand rim 120, and motion sensor 114 may detect whether back wheel 110 is in motion. Capacitive touch sensor 112 and motion sensor 114 communicate with processor 152. For example, capacitive touch sensor 112 and motion sensor 114 may be connected to wheel-mounted processor 217. Wheel-mounted processor 217 may transit sensor data from capacitive touch sensor 112 and motion sensor 114 to processor 152 using transceiver 219. In some cases, wheel-mounted processor 217 may further transmit battery information of first power source 218 to processor 152. In some cases, processor 152 may determine whether the user is touching hand rim 120 and whether the chair 110 is in motion. In some embodiments, wheel-mounted processor 217 may provide information changes (e.g., when the wheels start or stop moving and when a user stops or starts holding the hand rim). Wheel-mounted processor 217 may provide the determination to processor 152 through transceiver 219.

When the chair 110 is stopped and a user is not touching hand rim 120, processor 152 may activate motor 154, which engages the locking mechanism 259. For example, motor 154 may drive body-mounted lock plate 156 to mate with wheel-mounted lock plate 116. In some embodiments, processor 152 may further engage or disengage the locking mechanism 259 based on a power state of first power source 218. For example, if first power source 218 is almost out of power, when processor 152 engages the locking mechanism 259, first power source 218 may not have sufficient power to detect or report disengagement conditions (e.g., touch sensor 112 and motion sensor 114 may not have sufficient power to monitor the state of touch or speed).

After the locking is engaged, processor 152 may determine when a user touches hand rim 120 and may activate the motor to disengage the locking mechanism 259. For instance, the motor may retract body-mounted lock plate 156 from its mating position with wheel-mounted lock plate 116.

In some cases, the locking mechanism 259 engagement and or disengagement may be independently (e.g., separately) determined for each wheel. For example, when in an unlocked state, if processor 152 determines that the wheelchair 100 is stopped and the user is only touching the left wheel hand rim 120, only a right motor 154 may be activated, engaging only a right locking mechanism 259. Similarly, when in a locked stated, if processor 152 determines that the user only touches the left wheel hand rim 120, only a left motor 154 may be activated, disengaging only a left locking mechanism 259.

In some situations, locking mechanisms 259 may be engaged and/or disengaged using a magnetic persistent driver. Example magnetic persistent drivers are discussed below in greater detail with reference to FIGS. 3A-6F.

Magnetic Persistent Drivers

Magnetic persistent drivers provide persistent linear force through the use of magnet pairs (e.g., super magnets or neodymium magnets). The magnetic persistent drivers may fluctuate between two or more states by rotating one or more of the facing magnets to either align opposite poles, causing an attracting force, or align same poles, causing a repelling force.

Figure 3A:
FIGS. 3A and 3B illustrate typical pole-facing arrangement of magnets.
Figure 3A:
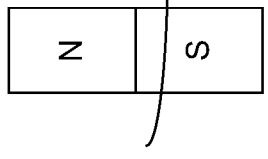
Figure 3B:
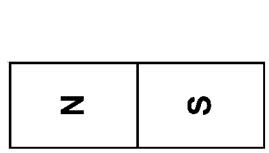
Figure 3B:
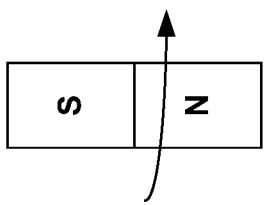

FIGS. 3A and 3B illustrate typical pole-facing arrangement of magnets in attracting and repelling orientations, respectively. Rotation of one magnet in the indicated direction has no effect on the attraction of the magnets, as the magnets will consistently repel or attract one another.

Figure 4A:
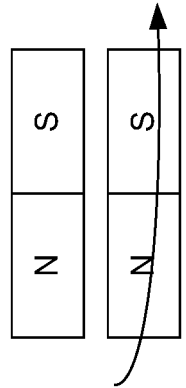
FIGS. 4A and 4B illustrate non-standard pole-parallel arrangement of magnets.
Figure 4B:
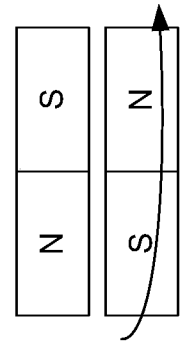

FIGS. 4A and 4B illustrate non-standard pole-parallel arrangement of magnets in attracting and repelling orientations. As can be seen, by rotating one magnet 180 degrees in the indicated direction, the magnetic force may transition from attracting to repelling, and vice versa. In some implementations may utilize pole-parallel arrangements within magnetic persistent drivers.

Figure 5A:
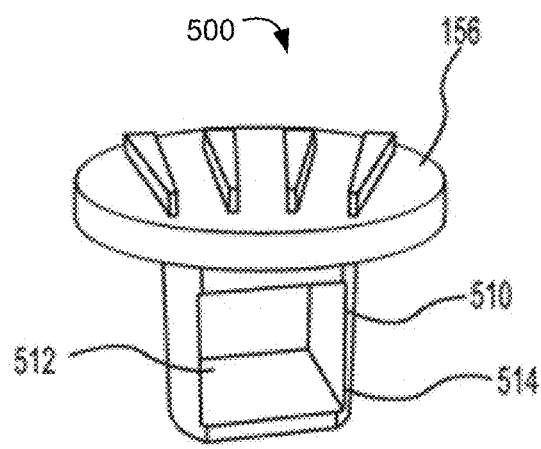
FIGS. 5A-5D illustrate a magnetic persistent driver according to an example embodiment.
Figure 5B:
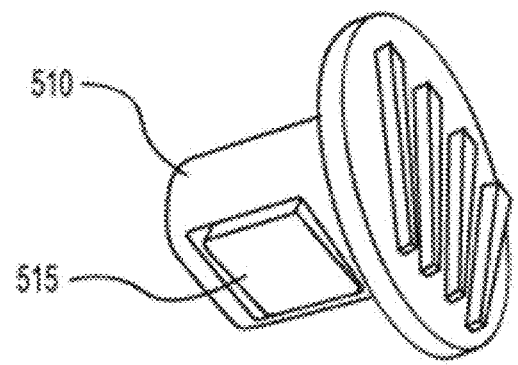
Figure 5C:
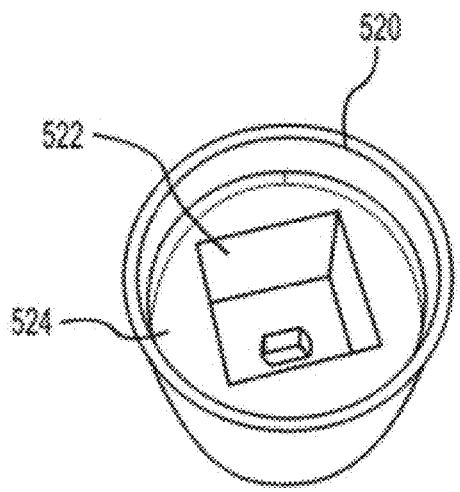
Figure 5D:
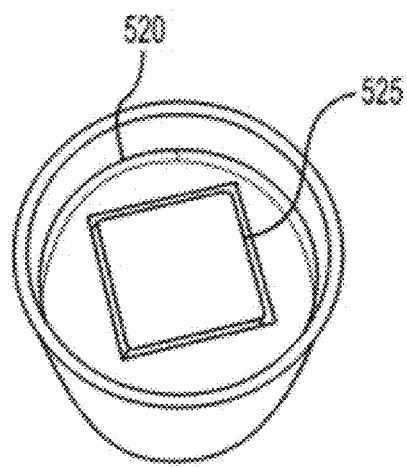

FIGS. 5A-5D illustrate a magnetic persistent driver 500 according to an example embodiment. The magnetic persistent driver 500 includes a pin 510 (FIGS. 5A and 5B) and a base 520 (FIGS. 5C and 5D). Pin 510 includes a first magnet 515, and base 520 includes a second magnet 525. For example, first magnet 515 may be disposed within magnet cavity 514 of pin 510. Similarly, second magnet 525 may be disposed within magnet cavity 524 of base 520. However, this is merely an example. In some embodiments, first magnet 515 and/or second magnet 525 may be formed as part of pin 510 and base 520, respectively.

In some embodiments, magnetic persistent driver 500 may include a single pair of magnets 515, 525 utilizing the non-standard pole-parallel arrangement to provide displacement of the pin using a smaller number of magnets, providing weight reduction. Further, as the single magnet may be disposed in a center of rotational motion (e.g., an axis of rotation), the rotational momentum of the base may be minimized, providing power savings for motor operation.

When base 520 is rotated 180 degrees, the initial attracting force of first and second magnets 515, 525 becomes a repelling force. Pin 510 is then driven away from base 520. When magnets 515, 525 are oriented to attract, shaft 512 of pin 510 may be disposed within the pin cavity 522 of base 520. When magnets 515, 525 are oriented to repel, at least a portion of shaft 512 may be forced out pin cavity 522.

In some implementations, body-mounted lock plate 156 may be disposed on an end of pin 510 (e.g., integral with an end of pin 510). The driving of pin 510 may drive body-mounted lock plate 156 to mate with wheel-mounted lock plate 116. In some embodiments, motor 154 may be connected to base 520, and may be configured to rotate base 520 to engage the locking mechanism. For example, motor 154 may be are mounted on wheel lock brackets (see, e.g., FIGS. 9A-9C). A drive shaft of motor 154 may be connected to base 520 to enable rotation of base 520.

As will be understood by one of ordinary skill, perfect misalignment of the poles (e.g., the poles being exactly 180 degrees from perfect alignment) creates a fragilely stable repulsive force. In other words, if base 520 is rotated exactly 180 degrees from alignment, pin 510 would be driven away from base 520. However, if base 520 is rotated slightly less than 180 degrees, the repulsive force would also attempt to rotate base 520 back to its initial condition (i.e., with the poles aligned). Similarly, if base 520 is rotated slightly more than 180 degrees, the repulsive force would also attempt to continue rotating base 520 until it is back to its initial condition (i.e., with the poles aligned). Accordingly, in in certain embodiments, base 520 may be configured to be rotated slightly more than 180 degrees. For example, base 520 may be rotates 185 degrees, having a mechanical stop preventing further rotation.

In some cases, at least a portion of base 520 may be substantially cylindrical. In some situations, the mechanical stop may be designed into the base. For example, the base may include a cylindrical portion and a non-cylindrical portion. The non-cylindrical portion may prevent rotation beyond a certain degree. In some situations, motor 154 may include stops to prevent rotation beyond a certain degree.

In some implementations, motor 154 may be a limited rotation motor 154, and the structure of the limited rotation motor 154 prevents rotation beyond a certain degree. In some embodiments, motor 154 may be a highly-geared motor (e.g., a highly-geared standard motor or a stepper motor), and the gearing may resist rotation beyond a certain degree.

Although a single pair of complimentary magnets may be in a pole-parallel arrangement, this is merely an example. In some embodiments, two or more magnets pairs of magnets may be used to provide a driving force. FIGS. 6A-6F illustrate various magnet arrangements within a base 520 or pin 510 that may be used in certain example embodiments of magnetic persistent drivers 500. One of ordinary skill would understand that complementary magnet arrangements would be disposed in corresponding pin 510 or base 520.

Figure 6A:
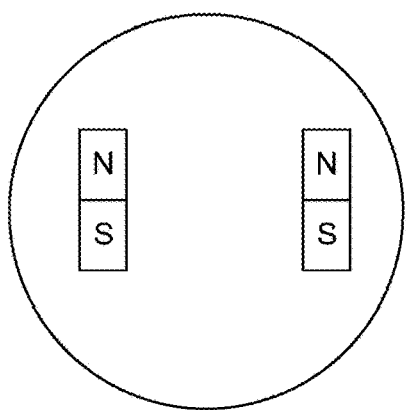
FIGS. 6A-6F illustrate various magnet arrangements according to certain example embodiments.
Figure 6B:
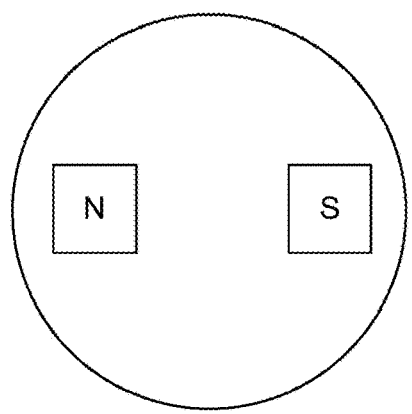
Figure 6C:
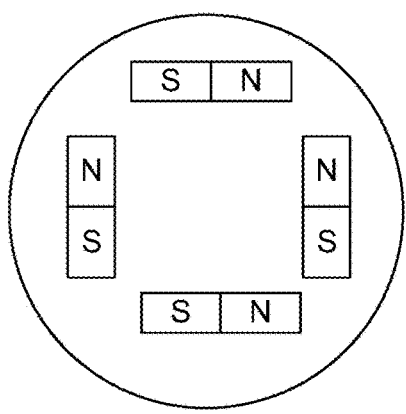
Figure 6D:
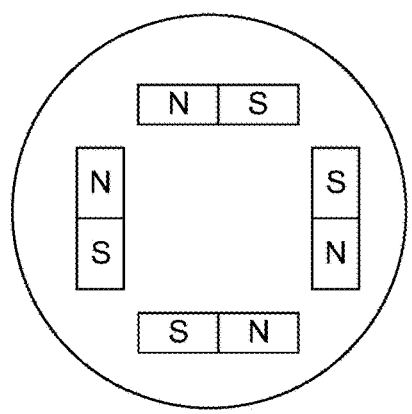
Figure 6E:
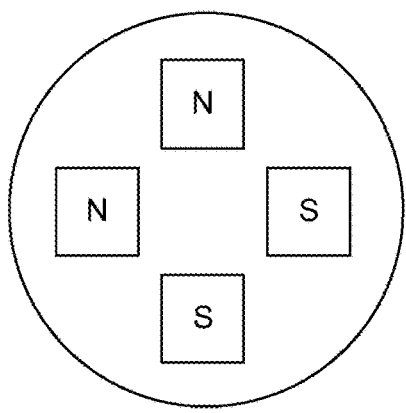
Figure 6F:
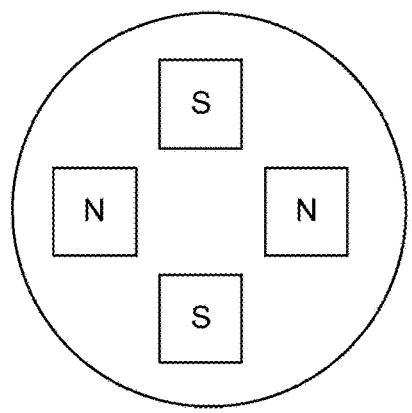

FIGS. 6A and 6B illustrate the use of two magnets with pole-parallel and pole-facing arrangements, respective. FIGS. 6C and 6D illustrate the use of four magnets with alternative pole-parallel arrangements. FIGS. 6E and 6F illustrate the use of four magnets with alternative pole-facing arrangements.

These are merely examples, and alternative orientations and alignments of various magnets would be understood by one of ordinary skill based on the present disclosure. Furthermore, one of ordinary skill would understand that, in certain arrangements, the transition between states (e.g., repelling and attracting) of the magnetic persistent driver may require different rotational amounts for different magnet arrangements. For example, the arrangements in FIGS. 6D and 6F would fully transition by rotating base 520 90 degrees. Moreover, one of ordinary skill would understand that a physical stop slightly past full transition (as discussed above with reference to the single magnetic pair example) could likewise be applied to these various arrangements to provide stable, persistent linear force.

The use of magnets within a wheelchair lock helps to overcome several challenges in the operation of the lock mechanisms. First, it is desirable to minimize power conception by only using power to change the state of the locks. Yet, in related mechanisms, if the teeth of the lock plates 116, 156 are not initially lined up with the matching gap in the teeth on the lock plate, back wheel 110 will not be locked after power is removed. However, since the magnets continue to exert a force on the lock plates 116, 156, the teeth will move into place as the wheel 110 moves slightly, locking the wheel 110. Second, if the locks are engaged but the wheels 110 are exerting significant torque on the locks (for example, if the chair 100 is on a slope), the locks may not be able to disengage when motor 154 rotates the magnets. However, because the magnets will continue to exert an attractive force, the user can simply relieve the torque on the teeth by manually rotating the wheels 110 (e.g., rocking the chair 110) and the lock plates 116, 156 will disengage.

One of ordinary skill would recognize similar and/or additional benefits for utilizing a magnetic persistent driver in a variety of additional mechanical and electro-mechanical systems and applications, including additional applications of a locking mechanism using a magnetic persistent driver.

Hub Connector

FIGS. 7A and 7B illustrate a wheel hub 130 and hub connector 710 according to an example embodiment. As can be seen, the backside 733 of spokes 732 infiltrate the interior of wheel hub 130. Hub connector 710 includes brackets 712 that protrude from the backside of the hub connector 710. Brackets 712 are configured to mate with the backsides of the spokes 732 to secure the hub connector 710 to wheel hub 130.

In some cases, wheel-mounted lock plate 116 may be secured to a front-face of the hub connector 710 (e.g., opposite brackets 712). Accordingly, wheel-mounted lock plate 116 may be easily installed and secured to wheel 110. In some cases, one or more of capacitive touch sensor 112, motion sensor 114, wheel-mounted processor 217, first power source 218, and transceiver 219 may be incorporated within the hub connector 710. For example, one or more of these wheel-mounted items may be disposed within a space interior defined by the hub connector 710 and/or wheel hub 130.

One of ordinary skill will recognize the benefit of easy connection and disconnection of the hub connector 710, both in wheel-chairs and for other wheeled devices. For example, various sensors may be easily added and removed to wheeled devices. Such alternative uses are anticipated within the scope of the present disclosure.

Lock Plates

Figure 8B:
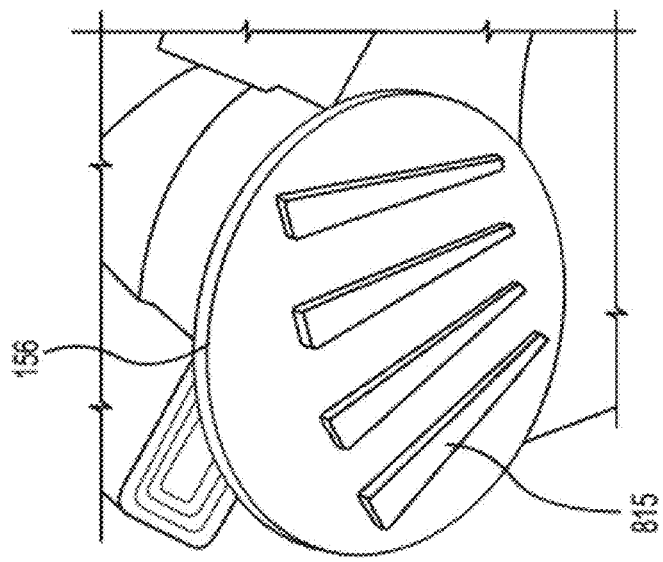
FIGS. 8A and 8B illustrate lock plates according to an example embodiment.
Figure 8A:
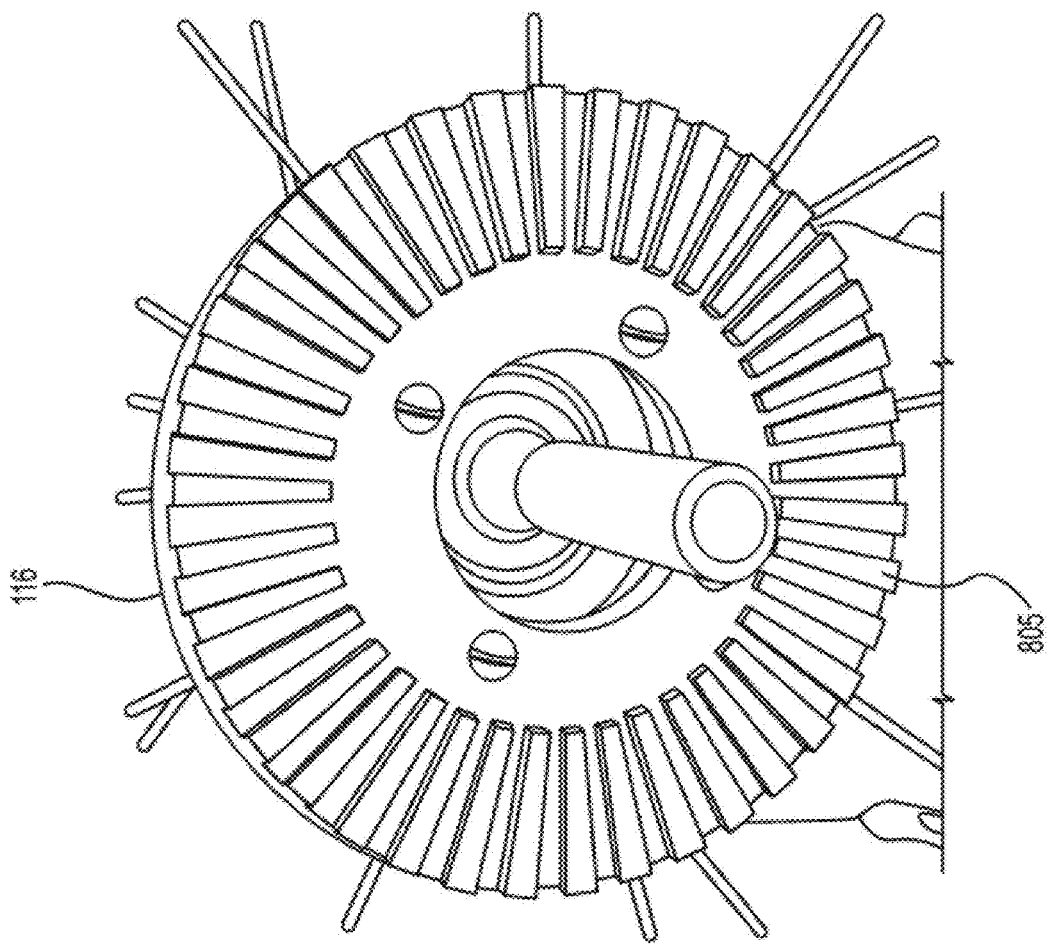

FIGS. 8A and 8B illustrate lock plates 116, 156 according to an example embodiment. Wheel-mounted lock plate 116 (FIG. 8A) may include a circular disk with a circular pattern of teeth 805 disposed thereon. Body-mounted lock plate 156 (FIG. 8B) includes complementary teeth 815 that are configured to mate with teeth 805. In some cases, teeth 805, 815 may be formed in a radiating (e.g., straight line) pattern. However, this is merely an example, and various shapes, patterns, and angles of lines may be utilized according to various embodiments.

For example, in some implementations, a wall of one or more of the teeth 805, 815 may not be perpendicular (e.g., slightly slanted) to the face of the lock plates 116, 156. The slant may facilitate disengagement/disengagement of the lock plates 116, 156. In some cases, one or more of teeth 805, 815 may be formed as trapezoidal solids. In some embodiments, one or more of teeth 805, 815 may be formed as triangular solids (e.g., saw-tooth pattern) such that the walls come to a point with no flat surface. In some cases, the one set of teeth 805, 815 may be formed as triangular solids and the other set of teeth 805, 815 may be formed as trapezoidal solids.

One of ordinary skill will recognize the benefits of lock plates over certain existing locking and braking solutions and will understand that they may be applied to various alternative rotating designs. As a non-limiting example, lock plates 116, 156 may be used in wheelchair locks that do not have an automatic engagement/disengagement mechanism. Such uses are anticipated within the scope of the present disclosure.

Mounting

FIGS. 9A-9C illustrate mounting an automatic wheelchair lock system 200 according to an example embodiment. FIG. 9A illustrates a bracket 960 for mounting a magnetic persistent driver 500 to an axel of wheelchair 100. Bracket 960 includes a space 962 to receive pin 510 (e.g., shaft 512 of pin 510), arms 964 to hold base 520, and mount 966 for mounting the bracket 960 to an axel of wheelchair 100. Space 962 may be dimensioned such that, when shaft 512 of pin 510 is situated in space 962, pin 510 may perform translational movement (e.g., up and down space 962), but may not rotate. Meanwhile, when base 520 is help by arms 964, base 962 may not move translationally (e.g., up and down arms 964), but may rotate within arms 964. Accordingly, base 520 may be rotated, forcing pin 510 outward from space 962.

FIGS. 9B and 9C illustrate bracket 960 mounted on an axel of wheelchair 120. In FIGS. 9B and 9C, motor 154 is mounted to a back of base 520, but this is merely an example. FIG. 9C illustrates a relative positioning of locking plate 710 to bracket 960. One of ordinary skill will recognize that the mounting and relative positioning are merely examples, and various changes and/or alterations may be made while remaining within the scope of the present disclosure.

Smart Locks

In some embodiments, the automatic wheelchair locks may be utilized as smart locks. In some instances, the wheelchair locks may be controllable using an external computing device (e.g., smartphone). As a non-limiting example, a smartphone application executing on the user's smartphone may communicate with processor 152 via low power Bluetooth to allow for easy customization and/or control of the automatic locks by the user. In some cases, such customization may include one or more of adjustment of touch/proximity sensitivity (e.g., to compensate for gloves or weather), adjustment of roll detection sensitivity, lock/unlock delay time, single wheel lock mode enable/disable, and provision for manually initiated locking/unlocking of the wheels.

In some cases, there may be provided a remote linked to processor 152, for controlling or adjusting operation of the automatic locks by the user.

One of ordinary skill will recognize that these are merely examples, and various adjustments, alterations, and additions are available to smart locks while maintaining within the scope of the present disclosure.

Additional Applications

Many aspects of the present disclosure may be readily utilized in numerous other applications, systems, and fields.

For instance, in some circumstances, certain elements of the present disclosure may provide automatic wheel-chair braking. For example, motion sensor 114 may be used to determine that the wheelchair 100 is moving at too great a speed. Processor 152 may activate motor 154 to engage a breaking mechanism to automatically slow down chair 100. As a non-limiting example, plates similar to lock plates 116 and 156 may be used, but including a braking mechanism (e.g., wheel-mounted plate 116 being configured to rotate under stress or teeth 805, 815 angled to resist rotation but not lock).

Example Use Case

An example prototype of an automatic wheelchair lock was successfully developed and tested. The following description describes certain aspects of the prototype. This description is not intended to be limiting, but is provided for illustrative purposes only.

There is provided an automatic wheelchair lock using capacitive touch technology on the hand rims for intuitive operation of the locks, gyroscopic motion detection on each wheel to ensure that the locks do not engage while the chair is in motion, wireless communication of the touch and motion status from each wheel to a central controller which operates the locks, and a magnetic persistent driver to hold the locks in the lock and unlock positions so that power is only required to change the state of the locks. Wheel mounted lock plates, axel-mounted lock plates, bracket, and motor mount may be printed in, for example, carbon fiber (e.g., carbon fiber infused PLA using a 3D FDM printer). However, this is merely an example and various materials and build processes would be known to one of ordinary skill in view of the present disclosure.

A microprocessor, a capacitive touch sensor (e.g., MPR121), a gyroscopic measurement sensor (e.g., MPU6050), a wireless transceiver (e.g., nRF24L01), and a rechargeable lithium ion battery may be provided on each wheel. The capacitive touch sensor is connected by a wire to one of the hand rim mounting screws. The capacitive touch sensor may be optimized to consistently detect the presence and absence of a hand on the hand rim. The gyroscopic sensor may transmit current x, y and z angles of the wheel to the microprocessor, which compares the current values with previous values and determines whether the chair is in motion. Using the wireless transceiver, the microprocessor transmits the touch, motion, and battery status to the axel mounted central controller.

Wheel mounted lock plates may be mounted on the outside of the hub on the interior of each wheel. The wheel mounted lock plates may include a circular disk with a matching circular pattern of teeth. The wheel mounted lock plates may be held in position by brackets that mount on the back side of ends of the spokes (e.g., a hub connector). However, this is merely an example, and, in some cases, the lock plate may be attached to the wheel by clipping to the spoke ends on the interior of the hub, thereby avoiding the use of separate mounting brackets.

A central controller microprocessor may be mounted to the axel, and interface with a wireless transceiver (e.g., nRF24L01) and motors that control the status of the wheel locks. Rechargeable lithium ion battery may provide power to the microprocessor transceiver, and motors. Also mounted on the axel are the wheel lock brackets which include a magnetic persistent driver. The motors are mounted on the wheel lock brackets with their drive shafts connected to the housing of one of the super magnets.

As an example, the central controller may be configured to, in response to receiving confirmation that 1) each wheel is not in motion, 2) no hand is on the hand rim, and 3) that the relevant power sources have sufficient charge, operate the attached electric motors and spins one of the pair of super magnets at each wheel a little over 180 degrees until it is stopped by a mechanical stop.

In some cases, the super magnets are arranged pole-parallel alignments (as opposed to the typical pole-facing alignment). Initially, the magnets are arranged with like poles at opposite ends of the magnets creating a very strong attraction between them. When the motor rotates one of the magnets 180 degrees, the like poles become aligned which creates a very strong repelling force. The rotated magnet is mounted in a cylinder which does not allow it to react to the repelling force while the other magnet is mounted in the locking pin, which slides at least partially from its housing in the mounting bracket. As it slides out of its housing, the teeth on the lock plate at the end of the locking pin engage with the teeth on the wheel-mounted lock plate, locking the wheel.

When the central controller receives confirmation that either hand rim has been touched, it rotates the motor 180 degrees in the opposite direction until another mechanical stop is reached. This once again aligns the opposite poles on the magnets and the locking pin is pulled back into its housing unlocking the wheel. The use of the super magnets may help overcome several challenges in the operation of the locks, as discussed above.

Example Computing System Architecture

Figure 10:
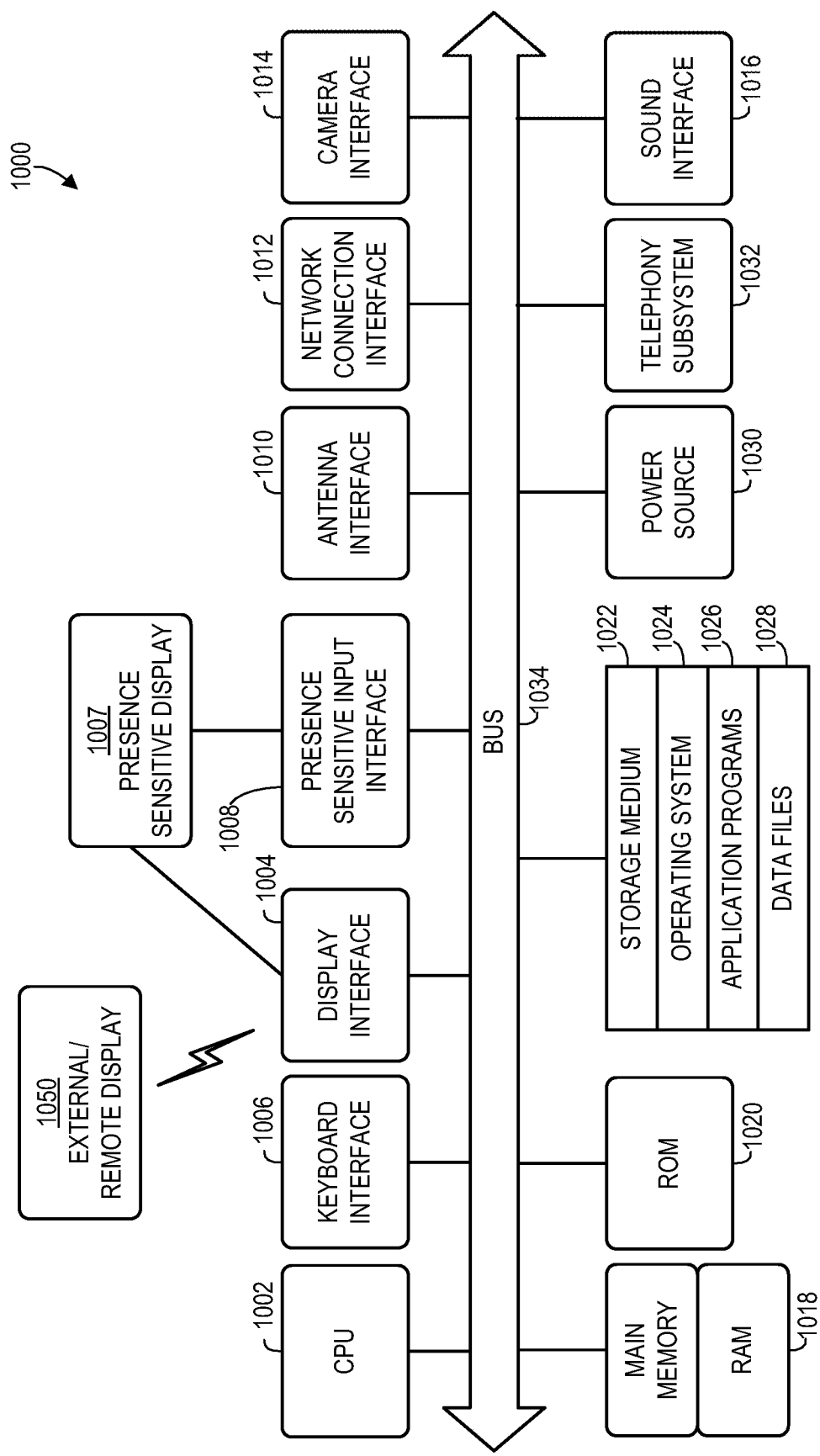
FIG. 10 is a block diagram of an illustrative computer system architecture according to an example embodiment.

FIG. 10 is a block diagram of an illustrative computer system architecture 1000, according to an example implementation. As non-limiting examples, processor 152, wheel-mounted processor 217, and an external computing device may be implemented using one or more elements from the computer system architecture 1000. It will be understood that the computing device architecture 1000 is provided for example purposes only and does not limit the scope of the various implementations of the present disclosed systems, methods, and computer-readable mediums.

The computing device architecture 1000 of FIG. 10 includes a central processing unit (CPU) 1002, where computer instructions are processed, and a display interface 1004 that acts as a communication interface and provides functions for rendering video, graphics, images, and texts on the display. In certain example implementations of the disclosed technology, the display interface 1004 may be directly connected to a local display, such as a touch-screen display associated with a mobile computing device. In another example implementation, the display interface 1004 may be configured for providing data, images, and other information for an external/remote display 1050 that is not necessarily physically connected to the mobile computing device. For example, a desktop monitor may be used for mirroring graphics and other information that is presented on a mobile computing device. In certain example implementations, the display interface 1004 may wirelessly communicate, for example, via a Wi-Fi channel or other available network connection interface 1012 to the external/remote display 1050.

In an example implementation, the network connection interface 1012 may be configured as a communication interface and may provide functions for rendering video, graphics, images, text, other information, or any combination thereof on the display. In one example, a communication interface may include a serial port, a parallel port, a general-purpose input and output (GPIO) port, a game port, a universal serial bus (USB), a micro-USB port, a high definition multimedia (HDMI) port, a video port, an audio port, a Bluetooth port, a near-field communication (NFC) port, another like communication interface, or any combination thereof. In one example, the display interface 1004 may be operatively coupled to a local display, such as a touch-screen display associated with a mobile device. In another example, the display interface 1004 may be configured to provide video, graphics, images, text, other information, or any combination thereof for an external/remote display 1050 that is not necessarily connected to the mobile computing device. In one example, a desktop monitor may be used for mirroring or extending graphical information that may be presented on a mobile device. In another example, the display interface 1004 may wirelessly communicate, for example, via the network connection interface 1012 such as a Wi-Fi transceiver to the external/remote display 1050.

The computing device architecture 1000 may include a keyboard interface 1006 that provides a communication interface to a keyboard. In one example implementation, the computing device architecture 1000 may include a presence-sensitive display interface 1008 for connecting to a presence-sensitive display 1007. According to certain example implementations of the disclosed technology, the presence-sensitive display interface 1008 may provide a communication interface to various devices such as a pointing device, a touch screen, a depth camera, etc. which may or may not be associated with a display.

The computing device architecture 1000 may be configured to use an input device via one or more of input/output interfaces (for example, the keyboard interface 1006, the display interface 1004, the presence sensitive display interface 1008, network connection interface 1012, camera interface 1014, sound interface 1016, etc.) to allow a user to capture information into the computing device architecture 1000. The input device may include a mouse, a trackball, a directional pad, a track pad, a touch-verified track pad, a presence-sensitive track pad, a presence-sensitive display, a scroll wheel, a digital camera, a digital video camera, a web camera, a microphone, a sensor, a smartcard, and the like. Additionally, the input device may be integrated with the computing device architecture 1000 or may be a separate device. For example, the input device may be an accelerometer, a magnetometer, a digital camera, a microphone, and an optical sensor.

Example implementations of the computing device architecture 1000 may include an antenna interface 1010 that provides a communication interface to an antenna; a network connection interface 1012 that provides a communication interface to a network. As mentioned above, the display interface 1004 may be in communication with the network connection interface 1012, for example, to provide information for display on a remote display that is not directly connected or attached to the system. In certain implementations, a camera interface 1014 is provided that acts as a communication interface and provides functions for capturing digital images from a camera. In certain implementations, a sound interface 1016 is provided as a communication interface for converting sound into electrical signals using a microphone and for converting electrical signals into sound using a speaker. According to example implementations, a random-access memory (RAM) 1018 is provided, where computer instructions and data may be stored in a volatile memory device for processing by the CPU 1002.

According to an example implementation, the computing device architecture 1000 includes a read-only memory (ROM) 1020 where invariant low-level system code or data for basic system functions such as basic input and output (I/O), startup, or reception of keystrokes from a keyboard are stored in a non-volatile memory device. According to an example implementation, the computing device architecture 1000 includes a storage medium 1022 or other suitable type of memory (e.g. such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives), where the files include an operating system 1024, application programs 1026 (including, for example, a web browser application, a widget or gadget engine, and or other applications, as necessary) and data files 1028 are stored. According to an example implementation, the computing device architecture 1000 includes a power source 1030 that provides an appropriate alternating current (AC) or direct current (DC) to power components.

According to an example implementation, the computing device architecture 1000 includes a telephony subsystem 1032 that allows the device 1000 to transmit and receive sound over a telephone network. The constituent devices and the CPU 1002 communicate with each other over a bus 1034.

According to an example implementation, the CPU 1002 has appropriate structure to be a computer processor. In one arrangement, the CPU 1002 may include more than one processing unit. The RAM 1018 interfaces with the computer bus 1034 to provide quick RAM storage to the CPU 1002 during the execution of software programs such as the operating system application programs, and device drivers. More specifically, the CPU 1002 loads computer-executable process steps from the storage medium 1022 or other media into a field of the RAM 1018 to execute software programs. Data may be stored in the RAM 1018, where the data may be accessed by the computer CPU 1002 during execution.

The storage medium 1022 itself may include a number of physical drive units, such as a redundant array of independent disks (RAID), a floppy disk drive, a flash memory, a USB flash drive, an external hard disk drive, thumb drive, pen drive, key drive, a High-Density Digital Versatile Disc (HD-DVD) optical disc drive, an internal hard disk drive, a Blu-Ray optical disc drive, or a Holographic Digital Data Storage (HDDS) optical disc drive, an external mini-dual in-line memory module (DIMM) synchronous dynamic random access memory (SDRAM), or an external micro-DIMM SDRAM. Such computer readable storage media allow a computing device to access computer-executable process steps, application programs and the like, stored on removable and non-removable memory media, to off-load data from the device or to upload data onto the device. A computer program product, such as one utilizing a communication system may be tangibly embodied in storage medium 1022, which may include a machine-readable storage medium.

According to one example implementation, the term computing device, as used herein, may be a CPU, or conceptualized as a CPU (for example, the CPU 1002 of FIG. 10). In this example implementation, the computing device (CPU) may be coupled, connected, and/or in communication with one or more peripheral devices, such as display. In another example implementation, the term computing device, as used herein, may refer to a mobile computing device such as a Smartphone, tablet computer, or smart watch. In this example implementation, the computing device may output content to its local display and/or speaker(s). In another example implementation, the computing device may output content to an external display device (e.g., over Wi-Fi) such as a TV or an external computing system.

In example implementations of the disclosed technology, a computing device may include any number of hardware and/or software applications that are executed to facilitate any of the operations. In example implementations, one or more I/O interfaces may facilitate communication between the computing device and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the computing device. The one or more I/O interfaces may be used to receive or collect data and/or user instructions from a wide variety of input devices. Received data may be processed by one or more computer processors as desired in various implementations of the disclosed technology and/or stored in one or more memory devices.

One or more network interfaces may facilitate connection of the computing device inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth enabled network, a Wi-Fi enabled network, a satellite-based network any wired network, any wireless network, etc., for communication with external devices and/or systems.

An embodiment of the present disclosure may be implemented according to at least the following:

Clause 1: A magnetic persistent driver comprising: a base comprising at least one base magnet; and a pin comprising at least one pin magnet, the base being configured to rotate with respect the pin between a first and second rotational position, and the pin being configured to move translationally with respect to the base. The at least one base magnet and the at least one pin magnet are configured to be substantially aligned in opposite polarities in the first rotational position of the base, and to be substantially aligned in same polarities in the second rotational position of the base.

Clause 2: The magnetic persistent driver of clause 1, wherein the pin is configured to be attracted to the base in the first rotational position and the pin is repelled by the base in the second rotational position.

Clause 3: The magnetic persistent driver of clause 1 or 2, wherein the at least one base magnet comprises a center base magnet positioned substantially in a rotational center of the base, and the at least one pin magnet comprises a center pin magnet substantially aligned with the center base magnet.

Clause 4: The magnetic persistent driver of any of clauses 1-3, wherein the at least one base magnet comprises two base magnets positioned opposite each other across from a rotational center of the base, and the at least one pin magnet comprises two pin magnets substantially aligned with the two base magnets.

Clause 5: The magnetic persistent driver of any of clauses 1-4, wherein the at least one base magnet comprises four base magnets positioned around a rotational center of the base, and the at least one pin magnet comprises four pin magnets substantially aligned with the four base magnets.

Clause 6: The magnetic persistent driver of clauses 1-5, wherein the base is further being configured to rotate with respect the pin between a third rotational position, and the at least one base magnet and the at least one pin magnet are configured such, in the third rotational position of the base, at least one of the at least one base magnets is substantially aligned in an opposite polarity to at least one of the at least one pin magnets and at least one of the at least one base magnets is substantially aligned to at least one of the at least one pin magnets in a same polarity.

Clause 7: The magnetic persistent driver of any of clauses 1-6, further comprising a motor configured to rotate the base between the first rotational position and the second rotational position.

Clause 8: The magnetic persistent driver of clause 7, wherein the motor comprises a step motor or a limited rotation motor.

Clause 9: The magnetic persistent driver of any of clauses 1-8, wherein the at least one base magnet and the at least one pin magnet are disposed in a pole-parallel arrangement relative an axis of rotation of the base.

Clause 10: The magnetic persistent driver of any of clauses 1-9, wherein the second rotational position of the base is substantially 180 degrees rotation from the first rotational position.

Clause 11: The magnetic persistent driver of any of clauses 1-10, wherein the second rotational position of the base is greater than 180 degrees rotation from the first rotational position.

Clause 12: The magnetic persistent driver of any of clauses 1-11 further comprising a mechanical stop preventing rotation of the base past the second rotational position.

Clause 13: A hub connector comprising: a hub-facing side comprising a plurality of brackets protruding therefrom and configured to mate to a backside of spokes intruding into a hub; and a front-face positioned opposite the hub-facing side.

Clause 14: The hub connector of clause 13 further comprising a lock plate positioned on the front-face.

Clause 15: The hub connector of clause 13 or 14, wherein an interior is defined by the hub-facing side and the front face, and the hub-connector further comprises one or more sensors disposed within the interior.

Clause 16: An automatic wheelchair locking system comprising: a first touch sensor configured to detect a touch of a first wheel of a wheelchair; a first lock for the first wheel; a first motor configured to engage and disengage the first lock; at least one processor configured to communicate with the first touch sensor and control the first motor; and a memory having stored thereon instructions that, when executed by the at least one processor, control the at least one processor to: in response to receiving sensor information indicative of a user touching the wheel while the first lock is engaged, control the first motor to disengage the first lock; and in response to receiving sensor information indicative of no user touching the wheel while the first lock is disengaged, control the first motor to engage the first lock.

Clause 17: The system of clause 16 further comprising a motion sensor configured to detect movement of the first wheel, wherein the at least one processor is further configured to communicate with the motion sensor, and the instructions, when executed by the at least one processor, control the at least one processor to, in response to receiving sensor information indicative of no touching of the first wheel and the first wheel no longer being in motion while the first lock is disengaged, control the first motor to engage the first lock.

Clause 18: The system of clause 17, wherein the motion sensor comprises a gyroscopic sensor configured to be attached to the first wheel.

Clause 19: The system of clauses 17 or 18, wherein the motion sensor comprises at least one of an accelerometer and a velocity meter.

Clause 20: The system of any of clauses 17-19, wherein the motion sensor is configured to detect movement of the wheelchair.

Clause 21: The system of any of clauses 16-20 further comprising: a second touch sensor configured to detect a touch of a second wheel of the wheelchair; a second lock for the second wheel; and a second motor configured to engage and disengage the second lock, wherein the instructions, when executed by the at least one processor, further control the at least one processor to: in response to receiving sensor information indicative of a user touching the second wheel while the second lock is engaged, control the second motor to disengage the second lock; and in response to receiving sensor information indicative of no user touching the second wheel while the second lock is disengaged, control the second motor to engage the second lock.

Clause 22: The system of clause 21, wherein the instructions, when executed by the at least one processor, control the at least one processor to only engage the first lock when engaging the second lock and only disengage the first lock when disengaging the second lock.

Clause 23: The system of clause 21, wherein the instructions, when executed by the at least one processor, control the at least one processor to engage or disengage the first lock independently from the second lock.

Clause 24: The system of any of clauses 16-23, wherein the first touch sensor comprises a capacitive touch sensor.

Clause 25: The system of clauses 24, wherein the capacitive touch sensor is configured to be connected to a hand rim of the first wheel.

Clause 26: The system of any of clauses 16-25, wherein lock comprises a plurality of locking plates.

Clause 27: The system of clause 26, wherein a first locking plate of the plurality of locking plates is configured to be disposed on the first wheel, and a second locking plate of the plurality of locking plates is configured to be disposed on an axel of the wheelchair.

Clause 28 The system of clause 27, wherein the second locking plate is disposed on a locking pin configured to be driven by the first motor.

Clause 29: The system of clauses 27 or 28, wherein the first motor is configured to rotate a magnet to drive the locking pin towards the first locking plate.

Clause 30: The system of any of clauses 16-29, wherein the first motor comprises a step motor or a limited rotation motor.

Clause 31: The system of any of clauses 27-30, wherein the first locking plate and the second locking plate are configured to be disposed in at least one of a drum brake configuration and a disc brake configuration.

Clause 32: The system of any of clauses 27-30, wherein the first locking plate comprises a substantially circular disk with a circular pattern of teeth disposed thereon.

Clause 33: The system of any of clauses 27-32, wherein the first locking plate and the second locking plate comprise a plurality of complementary juts and recesses.

Clause 34: The system of any of clauses 27-33, wherein at least of the first locking plate and the second locking plate comprise a plurality of angled protrusions.

Clause 35: The system of any of clauses 34, wherein the plurality of angled protrusions comprise at least one of a trapezoidal solid and a triangular solid.

Clause 36: The system of any of clauses 16-35, wherein the first lock comprises a magnetic persistent driver.

Clause 37 Clause 37: The system of any of clauses 16-36 further comprising a release configured to control disengagement of the first lock.

Clause 38: The system of any of clauses 16-37 further comprising a transceiver, wherein the instructions, when executed by the at least one processor, control the at least one processor to receive commands, through the transceiver, from an external device.

Clause 39: The system of clause 38, wherein the instructions, when executed by the at least one processor, control the at least one processor to control engagement and disengagement of the first lock based on the commands from the external device.

Clause 40: The system of clause 38 or 39, wherein the instructions, when executed by the at least one processor, control the at least one processor to adjust a sensitivity of the first touch sensor based on the commands from the external device.

Clause 41: The system of clause 40, wherein the commands to adjust the sensitivity of the first touch sensor are based on local weather.

Clause 42: The system of any of clauses 16-41, wherein at least one of the first motor, the at least one processor, and a portion of the first lock are configured to be attached to an axel of the wheelchair.

Clause 43: The system of any of clauses 16-42 further comprising a hub connector configured to mount to ends of spokes of the first wheel.

Clause 44: The system of clause 43, wherein at least one of the first touch sensor and a portion of the first lock are attached to the hub connector.

Clause 45: The system of any of clauses 16-44, wherein the first lock comprises at least one from among a scissor lock, a wheel hub lock, and a push/pull lock.

Clause 46: The system of any of clauses 16-45, wherein the first lock comprises at least one from among a disc brake, a drum brake, and a rotor brake.

Clause 47: The system of any of clauses 16-46, wherein the first motor drives a pneumatic brake.

Clause 48: The system of any of clauses 16-47 further comprising an inclination sensor configured to sense an angle of incline of the wheelchair.

Clause 49: The system of clause 48, wherein the at least one processor is further configured to determine an elevation gain of the wheelchair based on the angle of incline sensed by the inclination sensor.

Clause 50: An automatic wheelchair locking system comprising: a touch sensor configured to detect a touch of a wheel of a wheelchair; a motion sensor configured to detect motion of the wheelchair; a lock for the wheel; and a motor configured to engage and disengage the lock in response to detection signals from the touch sensor and the motion sensor.

Clause 51: The system of clause 50 further comprising a transceiver configured to receive instructions from an external device.

Clause 52: The system of clause 51, wherein the system is configured to adjust, based on the instructions from the external device, perform at least one from among: adjustment of a sensitivity of the touch sensor, adjustment of a sensitivity of the motion sensor, adjustment of a delay time before engaging or disengaging the lock in response to the detection signals from the touch sensor and the motion sensor; and engagement or disengagement of the lock.

Clause 53: The system of clause 51 or 52, wherein the external device comprises a remote.

Clause 54: An automatic wheelchair locking system comprising: a motion sensor configured to detect motion of a wheelchair; a brake for a wheel of the wheelchair; and a motor configured to engage and disengage the brake based on detection signals from the motion sensor.

Clause 55: The system of clause 54, wherein the system is configured to automatically engage the brake in response to determining that the wheelchair is moving at too great a speed.

Clause 56: An automatic wheelchair locking system comprising: means for determining whether a hand is touching a wheel of a wheelchair; means for determining whether the wheel is in motion; a locking mechanism for locking the wheel; and means for automatically engaging the locking mechanism when the wheel is not in motion and a hand is not touching the wheel, and for automatically disengaging the locking mechanism when a hand touches the wheel.

Clause 57: The system of any of clauses 16-56, comprising a magnetic persistent driver of any of clauses 1-12.

Clause 58: The system of any of clauses 16-57, comprising a hub connector of any of clauses 13-15.

Clause 59: A wheelchair comprising the automatic wheelchair locking system of any of clauses 16-58.

Clause 60: A kit comprising the automatic wheelchair locking system of any of clauses 16-58.

As used in this application, the terms "component," "module," "system," "server," "processor," "memory," and the like are intended to include one or more computer-related units, such as but not limited to hardware, firmware, a combination of hardware and software, software, or software in execution. For example, a component may be, but is not limited to being, a process running on a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Certain embodiments and implementations of the disclosed technology are described above with reference to block and flow diagrams of systems and methods and/or computer program products according to example embodiments or implementations of the disclosed technology. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, may be repeated, or may not necessarily need to be performed at all, according to some embodiments or implementations of the disclosed technology.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks.

As an example, embodiments or implementations of the disclosed technology may provide for a computer program product, including a computer-usable medium having a computer-readable program code or program instructions embodied therein, said computer-readable program code adapted to be executed to implement one or more functions specified in the flow diagram block or blocks. Likewise, the computer program instructions may be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

In this description, numerous specific details have been set forth. It is to be understood, however, that implementations of the disclosed technology may be practiced without these specific details. In other instances, well-known methods, structures and techniques have not been shown in detail in order not to obscure an understanding of this description. References to "one embodiment," "an embodiment," "some embodiments," "example embodiment," "various embodiments," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrase "in one implementation" does not necessarily refer to the same implementation, although it may.

Throughout the specification and the claims, the following terms take at least the meanings explicitly associated herein, unless the context clearly dictates otherwise. The term "connected" means that one function, feature, structure, or characteristic is directly joined to or in communication with another function, feature, structure, or characteristic. The term "coupled" means that one function, feature, structure, or characteristic is directly or indirectly joined to or in communication with another function, feature, structure, or characteristic. The term "or" is intended to mean an inclusive "or." Further, the terms "a," "an," and "the" are intended to mean one or more unless specified otherwise or clear from the context to be directed to a singular form. By "comprising" or "containing" or "including" is meant that at least the named element, or method step is present in article or method, but does not exclude the presence of other elements or method steps, even if the other such elements or method steps have the same function as what is named.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain embodiments of this disclosure have been described in connection with what is presently considered to be the most practical and various embodiments, it is to be understood that this disclosure is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the technology and also to enable any person skilled in the art to practice certain embodiments of this technology, including making and using any apparatuses or systems and performing any incorporated methods. The patentable scope of certain embodiments of the technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An automatic wheelchair locking system comprising:
   a first touch sensor configured to detect a touch of a first wheel of a wheelchair;
   a first lock for the first wheel;
   a first motor configured to engage and disengage the first lock;
   at least one processor configured to communicate with the first touch sensor and control the first motor; and
   a memory having stored thereon instructions that, when executed by the at least one processor, control the at least one processor to:
      in response to receiving sensor information from the first touch sensor indicative of a user touching the first wheel while the first lock is engaged, control the first motor to disengage the first lock; and
      in response to receiving sensor information from the first touch sensor indicative of no user touching the first wheel while the first lock is disengaged, control the first motor to engage the first lock.

2. The system of claim 1 further comprising a motion sensor configured to detect movement of the first wheel, wherein
   the at least one processor is further configured to communicate with the motion sensor, and
   the instructions, when executed by the at least one processor, control the at least one processor to, in response to receiving sensor information indicative of no touching of the first wheel and the first wheel no longer being in motion while the first lock is disengaged, control the first motor to engage the first lock.

3. The system of claim 1 further comprising:
   a second touch sensor configured to detect a touch of a second wheel of the wheelchair;
   a second lock for the second wheel; and
   a second motor configured to engage and disengage the second lock,
   wherein the instructions, when executed by the at least one processor, further control the at least one processor to:
      in response to receiving sensor information from the second touch sensor indicative of a user touching the second wheel while the second lock is engaged, control the second motor to disengage the second lock; and
      in response to receiving sensor information from the second touch sensor indicative of no user touching the second wheel while the second lock is disengaged, control the second motor to engage the second lock.

4. The system of claim 3, wherein the instructions, when executed by the at least one processor, control the at least one processor to:
   engage and disengage the first lock independently from the second lock based on sensor information from the first touch sensor; and engage and disengage the second lock independently from the first lock based on sensor information from the second touch sensor.

5. The system of claim 1, wherein the first touch sensor comprises a capacitive touch sensor configured to be connected to a hand rim of the first wheel.

6. The system of claim 1, wherein lock comprises:
a first locking plate configured to be disposed on the first wheel, and
a second locking plate configured to be disposed on an axel of the wheelchair.

7. The system of claim 6, wherein the second locking plate is disposed on a locking pin configured to be driven by the first motor.

8. The system of claim 7, wherein the first locking plate comprises a substantially circular disk with a circular pattern of teeth disposed thereon.

9. The system of claim 1, wherein
the first lock comprises a magnetic persistent driver including at least one magnet, the magnetic persistent driver having a first rotational state of the at least one magnet and a second rotational state of the at least one magnet,
in the first rotational state, the magnetic persistent driver provides a persistent magnetic force to engage the first lock, and
in the second rotational state, the magnetic persistent driver provides a persistent magnetic force to disengage the first lock.

10. The system of claim 1 further comprising a release configured to control disengagement of the first lock.

11. The system of claim 1 further comprising a transceiver, wherein the instructions, when executed by the at least one processor, control the at least one processor to:
receive commands, through the transceiver, from an external device external to the automatic wheelchair system, the commands instructing engagement or disengagement of the first lock, and
control engagement and disengagement of the first lock based on the commands from the external device.

12. The system of claim 1, wherein the instructions, when executed by the at least one processor, control the at least one processor to adjust a sensitivity of the first touch sensor based on local weather.

13. The system of claim 1, wherein at least one of the first motor, the at least one processor, and a portion of the first lock are configured to be attached to an axel of the wheelchair.

14. The system of claim 1 further comprising a hub connector configured to mount to ends of spokes of the first wheel, wherein at least one of the first touch sensor and a portion of the first lock are attached to the hub connector.

15. The system of claim 1, wherein the first lock comprises at least one from among a scissor lock, a wheel hub lock, a push/pull lock, a disc brake, a drum brake, a rotor brake, and a pneumatic brake.

16. The system of claim 1 further comprising an inclination sensor configured to sense an angle of incline of the wheelchair,
wherein the at least one processor is further configured to determine an elevation gain of the wheelchair based on the angle of incline sensed by the inclination sensor.

17. An automatic wheelchair locking system comprising:
a touch sensor configured to detect a touch of a wheel of a wheelchair;
a motion sensor configured to detect motion of the wheelchair;
a lock for the wheel; and
a motor configured to:
disengage the lock in response to detection signals from the touch sensor indicating that the wheel is being touched while the lock is engaged, and
engage the lock in response to detection signals from the touch sensor indicating that the wheel is not being touched and detection signals from the motion sensor indicating that the wheelchair is substantially still while the lock is disengaged.

18. The system of claim 17 further comprising a transceiver configured to receive instructions from an external device external to the automatic wheelchair system, wherein the system is configured to, based on the instructions from the external device, perform at least one from among:
adjustment of a sensitivity of the touch sensor,
adjustment of a sensitivity of the motion sensor, and
adjustment of a delay time before engaging or disengaging the lock in response to the detection signals from the touch sensor and the motion sensor.

19. An automatic wheelchair locking system comprising:
means for determining whether a hand is touching a wheel of a wheelchair;
means for determining whether the wheel is in motion;
a locking mechanism for locking the wheel; and
means for automatically engaging the locking mechanism when the wheel is not in motion and a hand is not touching the wheel while the locking mechanism is disengaged, and
means for automatically disengaging the locking mechanism when a hand touches the wheel while the locking mechanism is engaged.

20. The system of claim 11, wherein the external device comprises a smartphone of the user.

* * * * *